Figure 1:
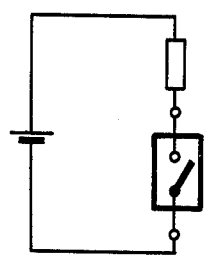

United States Patent [19]

Radziwill et al.

[11] 4,393,317
[45] Jul. 12, 1983

[54] MAGNETICALLY CONTROLLABLE ELECTRONIC SWITCH

[75] Inventors: Wolfgang Radziwill, Aachen; Günter Döring, Würselen, both of Fed. Rep. of Germany; Hans Steinbusch, Schaesberg, Netherlands

[73] Assignee: U.S. Philips Corporation, New York, N.Y.

[21] Appl. No.: 191,103

[22] Filed: Sep. 26, 1980

[30] Foreign Application Priority Data

Oct. 2, 1979 [DE] Fed. Rep. of Germany ....... 2939917

[51] Int. Cl.³ .............................................. H03K 3/26
[52] U.S. Cl. .................... 307/309; 307/270; 307/315
[58] Field of Search ............... 307/315, 308, 309, 270; 330/6; 324/317 H

[56] References Cited

U.S. PATENT DOCUMENTS

| | | | |
|---|---|---|---|
| 3,652,878 | 3/1972 | Schmidt | 307/309 |
| 3,657,576 | 4/1972 | Sieber | 307/309 |
| 3,894,250 | 7/1975 | Hager et al. | 307/309 |
| 3,959,669 | 5/1976 | Peters | 307/270 |
| 4,134,030 | 1/1979 | Pace | 307/309 |

FOREIGN PATENT DOCUMENTS 45-18335  4/1970  Japan .................................. 307/309

Primary Examiner—Stanley D. Miller
Assistant Examiner—B. P. Davis
Attorney, Agent, or Firm—Bernard Franzblau; Robert T. Mayer

[57] ABSTRACT

A magnetically controllable electronic switch in the form of an integrated semiconductor circuit comprises a first switching path between a first input terminal and an output terminal and a second switching path between a second input terminal and the output terminal. The two switching paths are controllable by a magnetic field in such a way that either the one or the other switching path is closed and the two switching paths are open in the transition range between these two modes. Such a switch is particularly suitable for use as an electronic commutator for small electric motors.

16 Claims, 6 Drawing Figures

MAGNETICALLY CONTROLLABLE ELECTRONIC SWITCH

The invention relates to a magnetically controllable electronic switch in the form of an integrated semiconductor circuit comprising a switching path which is controlled by a Hall element which is also incorporated in said integrated circuit.

Such switches are already known (for example Sprague, type ULS-3006 T and Texas Instruments, type TL 170 C.

However the use of these known switches is limited, because they can operate with one current direction only (i.e. these switches are unipolar), only the most negative potential of the circuit can be applied to the output terminal via the switch, the maximum output current is only of the order of magnitude of approximately 20 mA, and finally they exhibit a substantial switching hysteresis, i.e. the turn-on field strength is appreciably higher than the turn-off field strength. These properties limit the use of such a switch considerably, especially for controlling motors.

It is an object of the invention to make an electronic switch of the type mentioned in the opening paragraph substantially more versatile and in particular to make it suitable for use as an electronic commutator for a motor without additional circuitry.

According to the invention this object is achieved in that between a first input terminal and an output terminal there is arranged a first switching path and between a second input terminal and the output terminal there is arranged a second switching path, that the two switching paths can be controlled so that when the switch is exposed to a magnetic field with a component B which is normal to the Hall element, the first switching path is closed if $B > B_0 + (\Delta B/2)$, the second switching path is closed if $B < B_0 - (\Delta^2 B/2)$, and that the two switching paths are open if $$|B - B_0| < (\Delta B/2) \times \epsilon, \text{ while } 0 < \epsilon < 1 \text{ and } \Delta B \geq 0.$$

Further embodiments of the invention will be apparent from the sub-claims.

The particular advantages obtained by means of the invention are that the switches in accordance with the invention are very versatile (from simple magnetically actuated switches to bridge commutators with an arbitrary phase number in small electrical machines), that it has a high efficiency owing to the optimized switching operation, that it is suitable for switching inductive loads without additional precautions, that, in the form of a monolithic integrated circuit and mounted on a contact foil it can readily be arranged in the air gap of a motor, and that by leading out certain points of the circuit the control signals from the Hall generator can be combined with external signals in order to modify the control behaviour.

Figure 2:
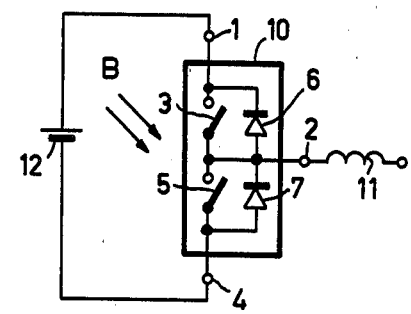
Figure 3:
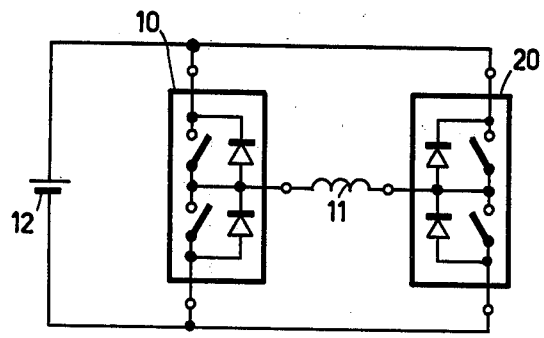
Figure 5:
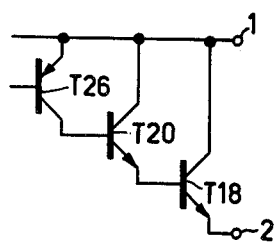
Figure 6:
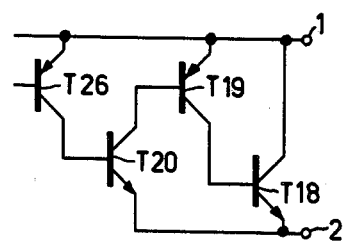
Figure 4:
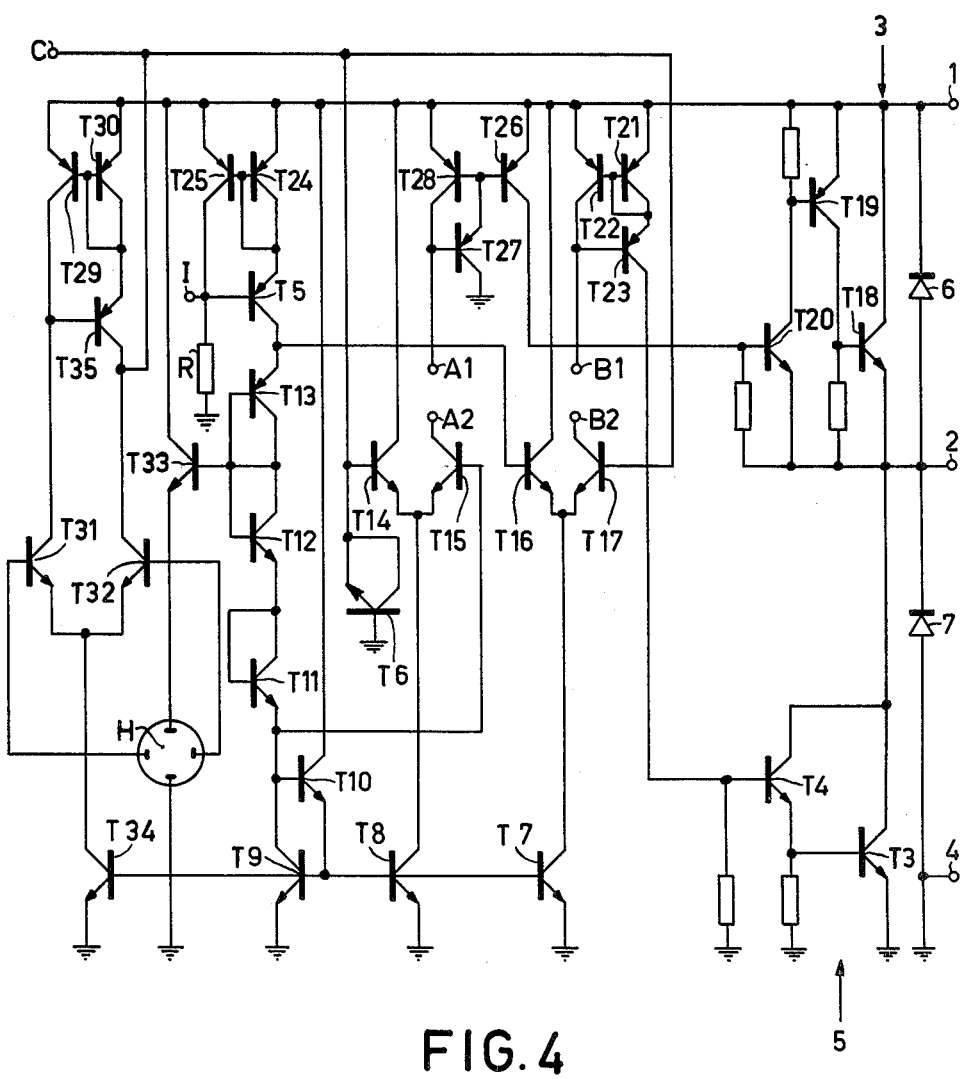

The invention will be described in more detail with reference to the accompanying drawings. In the drawings:

FIG. 1 represents a circuit including a switch in accordance with the prior art, FIG. 2 represents a simple circuit including a switch in accordance with the invention, FIG. 3 represents a bridge circuit including two switches in accordance with the invention, FIG. 4 is the circuit diagram of a switch in accordance with the invention in the form of a monolithic integrated circuit, and FIGS. 5, 6 represent two circuit details to illustrate the operation of the circuit of FIG. 4.

FIG. 1 represents a simple circuit including a unipolar magnetically controllable switch in accordance with the prior art. This switch has the drawbacks already mentioned.

FIG. 2 represents a circuit including a switch 10 in accordance with the invention, in which a first switching path 3 is arranged between a first input terminal 1 and an output terminal 2, to which a load 11 is connected, and a second switching path 5 is arranged between a second input terminal 4 and the output terminal 2. The current source 12 for energizing the load 11 is connected to the two input terminals 1 and 4. The two switching paths 3 and 4 are controlled by an externally applied magnetic field having a component B normal to the Hall element (not shown) in the switch, in such a way that the first switching path 3 is closed if $B > B_0 + (\Delta B/2)$, the second switching path 5 is closed if $B < B_0 - (\Delta B/2)$, and the two switching paths 3 and 5 are open if $|B - B_0| < (\Delta B/2) \times \epsilon$. Here, $B_0$ is a value which is given by the offset of the Hall element and which for a practical switch is $<25$ mT. $\epsilon$ is a value which follows from the tolerances of the circuit elements and which for a practical switch is between 0.5 and 1.

As is furthermore shown in FIG. 2, a by-pass freewheel diode 6 or 7 is connected in parallel with each respective switching path 3 or 5, which in the case of an inductive or active load also enables a load current to be obtained when the two controlled load sections are turned off.

FIG. 3 shows a bridge circuit comprising two switches 10 and 20. This may for example be a commutator bridge circuit for a motor whose stator winding is then constituted by the load 11.

FIG. 4 represents the circuit diagram of a switch in accordance with the invention in the form of a monolithic integrated circuit. At the right there are disposed three connection terminals 1, 2 and 4, the free-wheel diodes 6 and 7, as well as the transistors T3 and T18, which serve as the switching paths. The free-wheel diode 7 is constituted by the parasitic substrate diode of the transistor T3, while the free-wheel diode 6 is constituted by a transistor with a short-circuited base-emitter junction. The transistor T3, constituting the switching path 5, together with the transistor T4 constitutes a Darlington pair which is driven by a current mirror T21, T22, T23.

The transistor T18, which constitutes the switching path T3, however, is driven by the transistors T19 and T20, which in their turn are driven by the current mirror T26, T27, T28.

The transistor T18 is driven in a special manner. If in this case a Darlington pair were used, like in the lower stage (T3, T4), the circuit arrangement of FIG. 5 would be obtained with the inclusion of the current-mirror transistor T26. Across transistor T18 this would result in a voltage drop of $U_{CE18} = U_{CE26} + U_{BE20} + U_{BE18}$, which is approximately $U_{BE} \approx 0.7$ V higher than the voltage drop across T3 in which $U_{CE3} = U_{CE4} + U_{BE3}$. This drawback cannot be eliminated solely by means of a complementary Darlington stage, as is shown in FIG. 6 (transistors $T_{18}$ and $T_{19}$), because in bipolar integrated circuits PNP-transistors can only be realized with current gain factors which are one to two orders of magnitude smaller than those of NPN-transistors. If a second complementary Darlington stage were formed, by connecting the emitter of T20 in the circuit of FIG. 6 to the base of T18 instead of to the emitter, this would result in an excessive voltage drop acros T18. However, the circuit of FIG. 6, which in FIG. 4 only comprises the additional leakage resistances, ensures that said voltage drop is smaller and that all the currents in the combined circuit T18, T19, T20 only contribute to the load current and contain no dissipative components.

Thus, by means of the output stages of the switch in the circuit of FIG. 4, which begin at the current mirror circuits, an optimum efficiency is obtained. This is also attributable to the fact that the upper stage operates as an emitter-follower, the collector current of T26 varying proportionally to the load current at the output terminal 2.

The input terminals A1 and B1 of the two current mirrors are normally connected to the output terminals A2 and B2 of the rest of the circuit, but these terminals also accept external control signals for controlling the switching paths 3 and 5.

The control section of the circuit shown in FIG. 4 comprises a Hall element H, which is energized with a constant voltage, and an emitter follower T33, which element is followed by a differential amplifier T31, T32, whose output C is externally accessible, a multistage reference voltage source, and two trigger stages.

The reference voltage source comprises the emitter diodes of the transistors T9, T10, T11, T12 and T13, which are energized with a reference current obtained by means of the resistor R via a current mirror T5, T24 and T25. Via the terminal I the reference current can be varied. The reference voltage source first of all supplies the control voltage for the Hall element H. As a result of this the control current of the Hall element becomes independent of supply voltage variations. As soon as said requirements for turning on one of the two switching paths are met, the Hall voltage overdrives the following differential amplifier T31, T32, whose output current is coupled out asymmetrically via the current mirror T29, T30, T35 so as to supply the base currents for the transistors T14 and T17 of the respective differential amplifiers T14, T15 or T16, T17. These differential amplifiers operate as trigger circuits which respond at different voltage levels because the base voltages of T15 and T16 are reference voltages which differ by three diode voltage drops (T11, T12, T13). The transistor T15 supplies a collector current only if the base potential of the transistor T14 becomes smaller than the reference potential across transistor T15. Similarly, transistor T17 supplies a collector current only if the base potential of the transistor T17 becomes higher than the reference potential across the transistor T16. This step ensures that the two switching paths cannot be turned on simultaneously.

The Zener diode T6 ensures that in the case of an excessive supply voltage the maximum permissible base-emitter reverse voltage of the transistors T15 and T16 is not exceeded when the transistors T14 or T17 conduct. In order to obtain the required currents the emitter current sources of the differential amplifiers are constituted by the transistors T34, T8 and T17 which have different emitter areas and are arranged as output stages of a combined current mirror (with T9 and T10).

The transistors T18 and T3, constituting the switching paths 3 and 5, comprise a plurality (8 or 9) of parallel connected transistors.

The circuit arrangement shown in FIG. 4 was realized in the customary technology and mounted in a metal casing (SOT 14), a plastics enclosure (SO8) and on a foil.

The output current of the circuit can be 1 A for momentary operation or 400 mA for continuous operation. The rated operating voltage is 9 V. The permissible operating voltage lies between 4.5 and approximately 15 V.

A switch of the type described herein is particularly suitable for use as an electronic commutator in small electric motors.

What is claimed is:

1. A magnetically controllable integrated circuit electronic switch comprising, a Hall element exhibiting an offset corresponding to a magnetic field having a value $B_o$ and adapted to be controlled by a magnetic field having a component B normal to the Hall element, first and second electric supply input terminals and an output terminal, first and second electric switching paths coupled between the first and second supply input terminals and the output terminal, respectively, with each of said switching paths exhibiting a threshold $(\Delta B/2) \geq 0$, and means including said Hall element for controlling said first and second switching paths so that exposure of the Hall element to said magnetic field with said normal component B causes the first switching path to be closed if $B > B_0 + (\Delta B/2)$ and the second switching path to be closed if $B < B_0 - (\Delta B/2)$, and wherein the first and second switching paths are both open if $|B - B_0| < (\Delta B/2) \times \Gamma$, wherein $0 < \epsilon < 1$ and $\Gamma$ is a factor taking into account the transition between open and closed conditions of said switching paths.

2. A switch as claimed in claim 1 further comprising a free-wheel diode connected in parallel with each switching path.

3. A switch as claimed in claim 2, wherein the switching paths comprise bipolar transistors and the free-wheel diode connected in parallel with one switching path comprises the parasitic substrate diode of the corresponding transistor.

4. A switch as claimed in claim 1 wherein the first switching path comprises an NPN Darlington-stage and the second switching path comprises an NPN transistor connected in common-emitter arrangement and driven by a PNP transistor connected in common-collector arrangement, said PNP transistor being in turn driven by an NPN-transistor connected in common-emitter arrangement with the emitters of the two NPN transistors directly interconnected and connected to the output terminal.

5. A switch as claimd in claims 1, 3 or 4 further comprising first and second trigger stages coupled between the Hall element and the first and second switching paths, respectively, whereby each switching path can be controlled by a respective trigger stage, the trigger levels of said stages being selected so that they differ from each other by an amount which corresponds to a specific variation of the magnetic field B on the Hall element.

6. A switch as claimed in claim 5, as dependent on claim 1 only wherein the difference in trigger levels is determined by the voltage drops of a plurality of series-connected diodes coupled between input terminals of said first and second trigger stages.

7. A switch as claimed in claim 5 further comprising a connection between the Hall element and the trigger stages which includes a terminal at which either the amplified Hall voltage is available or via which the trigger stages can be driven by an external signal.

8. A switch as claimed in claim 1 further comprising a plurality of terminals to which further control signals for controlling the switching paths can be applied.

9. A switch as claimed in claim 1 further comprising a terminal at which a reference current can be obtained.

10. A switch as claimed in claim 1 in the form of a monolithic integrated circuit.

11. A switch as claimed in claim 10, characterized in that the integrated circuit is provided with a foil contact arrangement.

12. A switch as claimed in claim 1 further comprising a transistor connected to supply a constant voltage to the current path of the Hall element.

13. A magnetically controllable electronic switch comprising, a Hall element exhibiting an offset corresponding to a magnetic field $B_0$ and adapted to be controlled by a magnetic field having a component B normal to the Hall element, first and second input terminals adapted to be connected to a source of electric energy, an output terminal for connection to a load, first and second circuit paths coupled between said first and second input terminals and the output terminal, respectively, with each of said circuit paths including a switching transistor and each path exhibiting a threshold $(\Delta B/2) \geq 0$, and means including said Hall element for controlling said first and second circuit paths so that exposure of the Hall element to said magnetic field with said normal component B causes the first circuit path to be closed if $B > B_0 + (\Delta B/2)$ and the second circuit path to be closed if $B < B_0 - (\Delta B/2)$, and wherein the first and second circuit paths are both open if $|B - B_0| < (\Delta B/2) \times \epsilon$, wherein $0 < \epsilon < 1$ and the output terminal is connected to either the first or second input terminals or is disconnected from both input terminals as a function of the magnetic field B.

14. A switch as claimed in claim 13 further comprising first and second trigger stages for coupling an output signal of the Hall element to the switching transistors of said first and second circuit paths, respectively, and means for supplying different trigger voltage levels to said first and second trigger stages whereby the first and second circuit paths cannot conduct simultaneously.

15. A switch as claimed in claim 13 wherein the first circuit path includes a first transistor coupled to the one switching transistor in said first circuit path to form a Darlington stage, and the second circuit path includes second and third transistors of opposite conductivity types and the third transistor and the switching transistor of the second circuit path being of the same conductivity type, means connecting said switching transistor and said third transistor each in a common emitter configuration and the second transistor in a common collector configuration with the second transistor driving the switching transistor and the third transistor driving the second transistor, and means interconnecting a first electrode of the switching transistor and a first electrode of the third transistor to said output terminal.

16. A switch as claimed in claim 13 further comprising first and second current mirror circuits coupled to the switching transistors of said first and second circuit paths, respectively.

* * * * *

UNITED STATES PATENT AND TRADEMARK OFFICE
CERTIFICATE OF CORRECTION

PATENT NO. : 4,393,317
DATED : July 12, 1983
INVENTOR(S) : WOLFGANG RADZIWILL ET AL It is certified that error appears in the above-identified patent and that said Letters Patent is hereby corrected as shown below:

Column 1, line 13, after "limited" delete "," (comma)
line 38, change "$(\triangle^2 B/2)$" to --$(\triangle B/2)$-- line 41, change "while" to --where--;
after "and" insert --each switching path exhibits a threshold $\frac{\triangle B}{2}$ in which--

Column 3, line 66, change "T17" to --T7--

Column 4, line 8, before "output" insert --circuit can deliver a peak--;
line 8-9, cancel "the circuit can be 1A for momentary operation" and insert --1A--;
line 9, change "for" to --of--; change "operation" (last occurence) to --current--

Claim 1, line 18, after "X" change "$\Gamma$" to --$\mathcal{E}$--;
after "and" change "$\Gamma$" to --$\mathcal{E}$--

Signed and Sealed this

Twenty-first Day of May 1985

[SEAL]

Attest:

DONALD J. QUIGG

Attesting Officer    Acting Commissioner of Patents and Trademarks